US012696803B2

(12) United States Patent
Tong et al.

(10) Patent No.: US 12,696,803 B2
(45) Date of Patent: Jul. 28, 2026

(54) DIE PACKAGE INCLUDING A SEMICONDUCTOR DIE HAVING A CAVITY WITHIN WHICH A PASSIVE COMPONENT IS POSITIONED, IC PACKAGE AND MANUFACTURING PROCESS THEREOF

(71) Applicants: nD-HI Technologies Lab, Inc., Taipei City (TW); ETRON TECHNOLOGY, INC., Hsinchu (TW)

(72) Inventors: Ho-Ming Tong, Taipei City (TW); Chao-Chun Lu, Hsinchu (TW)

(73) Assignees: nD-HI Technologies Lab, Inc., Taipei City (TW); ETRON TECHNOLOGY, INC., Hsinchu (TW)

( * ) Notice: Subject to any disclaimer, the term of this patent is extended or adjusted under 35 U.S.C. 154(b) by 753 days.

(21) Appl. No.: 17/954,837

(22) Filed: Sep. 28, 2022

(65) Prior Publication Data

US 2023/0317693 A1     Oct. 5, 2023

Related U.S. Application Data

(60) Provisional application No. 63/324,654, filed on Mar. 29, 2022.

(51) Int. Cl.
*H10W 90/00*     (2026.01)
*H10W 72/00*     (2026.01)
(Continued)

(52) U.S. Cl.
CPC ....... *H10W 90/00* (2026.01); *H10W 72/0198* (2026.01); *H10W 74/014* (2026.01); *H10W 74/017* (2026.01); *H10W 74/117* (2026.01); *H10W 70/60* (2026.01); *H10W 72/859*

(2026.01); *H10W 72/865* (2026.01); *H10W 72/877* (2026.01); *H10W 72/884* (2026.01);
(Continued)

(58) Field of Classification Search
CPC .................. H01L 25/16; H01L 21/563; H01L 2224/24195; H01L 2924/19042; H10W 72/00; H10W 72/90; H10W 74/111; H10W 74/117; H10W 90/00; H10W 90/401; H10W 90/724; H10W 90/734; H10W 90/754
See application file for complete search history.

(56) References Cited

U.S. PATENT DOCUMENTS 9,660,017 B2 *  5/2017  Yeh ...................... H01L 23/3157
9,704,780 B2 *  7/2017  Marimuthu ............. H01L 24/96
(Continued)

OTHER PUBLICATIONS

Taiwanese Office Action and Search Report for Taiwanese Application No. 112110705, dated Jan. 30, 2024.

*Primary Examiner* — Khiem D Nguyen
(74) *Attorney, Agent, or Firm* — Birch, Stewart, Kolasch & Birch, LLP

(57)     ABSTRACT

A die package includes a semiconductor die, a passive component, a molding compound and a redistribution layer (RDL). The semiconductor die includes a first bonding pad. The passive component includes a second bonding pad. The molding compound encloses the semiconductor die and the passive component. The RDL is disposed over the semiconductor die and the passive component and electrically connecting the first bonding pad with the second bonding pad. The semiconductor die is vertically overlapped with the passive component.

14 Claims, 15 Drawing Sheets

(51) Int. Cl.

| | |
|---|---|
| *H10W 74/01* | (2026.01) |
| *H10W 74/10* | (2026.01) |
| *H10W 70/60* | (2026.01) |
| *H10W 74/15* | (2026.01) |

(52) U.S. Cl.
CPC .......... *H10W 74/012* (2026.01); *H10W 74/15* (2026.01); *H10W 90/722* (2026.01); *H10W 90/724* (2026.01); *H10W 90/732* (2026.01); *H10W 90/734* (2026.01); *H10W 90/753* (2026.01); *H10W 90/754* (2026.01)

(56) References Cited

U.S. PATENT DOCUMENTS

| | | | | |
|---|---|---|---|---|
| 9,985,010 | B2 * | 5/2018 | Rae | H01L 21/31 |
| 10,217,716 | B2 * | 2/2019 | Yu | H01L 23/5389 |
| 2008/0105964 | A1 * | 5/2008 | Iwamura | H01L 22/34 |
| | | | | 257/E21.531 |
| 2012/0129333 | A1 * | 5/2012 | Yim | H01L 24/11 |
| | | | | 257/E21.586 |
| 2012/0182066 | A1 * | 7/2012 | Merkle | H05K 1/185 |
| | | | | 427/508 |
| 2019/0214369 | A1 | 7/2019 | Seidemann et al. | |
| 2020/0051933 | A1 * | 2/2020 | Cha | H01L 23/49822 |
| 2020/0212018 | A1 | 7/2020 | Lai et al. | |
| 2020/0286814 | A1 * | 9/2020 | Mahajan | H01L 25/0652 |
| 2020/0373289 | A1 | 11/2020 | Yang et al. | |
| 2021/0057381 | A1 * | 2/2021 | Brun | H01L 23/053 |
| 2021/0082890 | A1 * | 3/2021 | Kim | H01L 23/5389 |

* cited by examiner

200

110u        160        150

220u

130

140

H1        H21

270        261        262 }260        263

280

110        H22        220

300

150

130        132        111

140u 390        390

140        320

270        320

280

321        110        321

320u

400

500

FIG. 12A
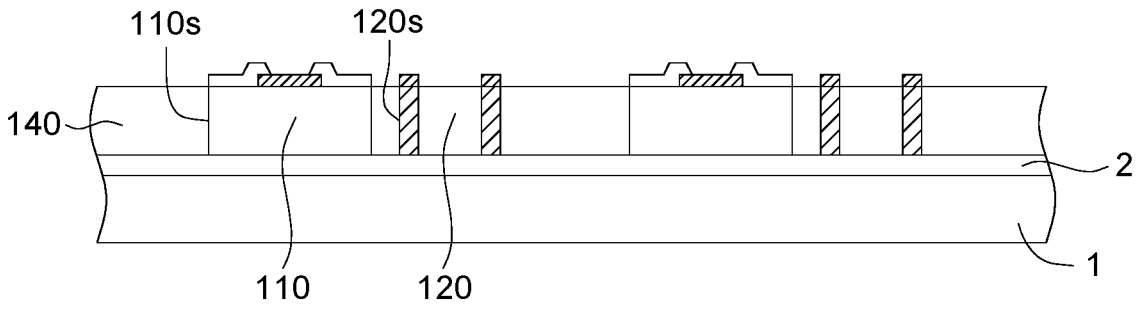
FIG. 12B
FIG. 12C

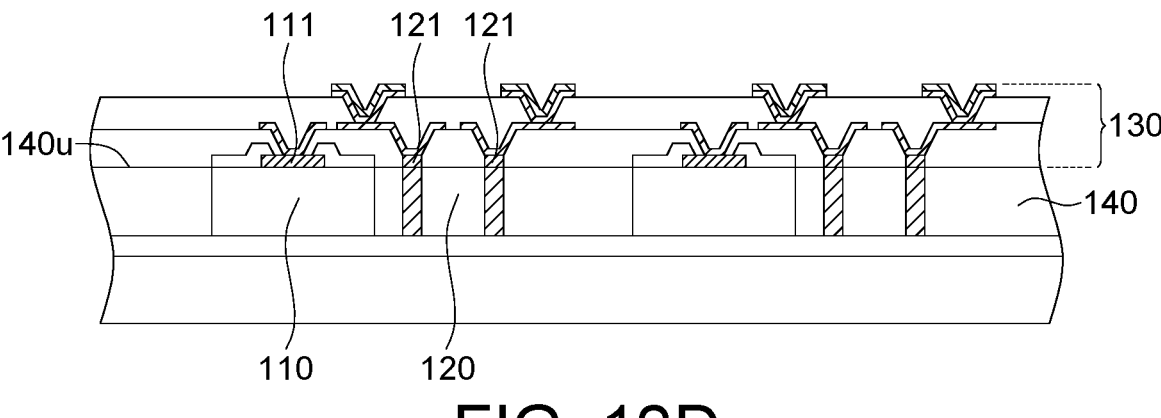
FIG. 12D
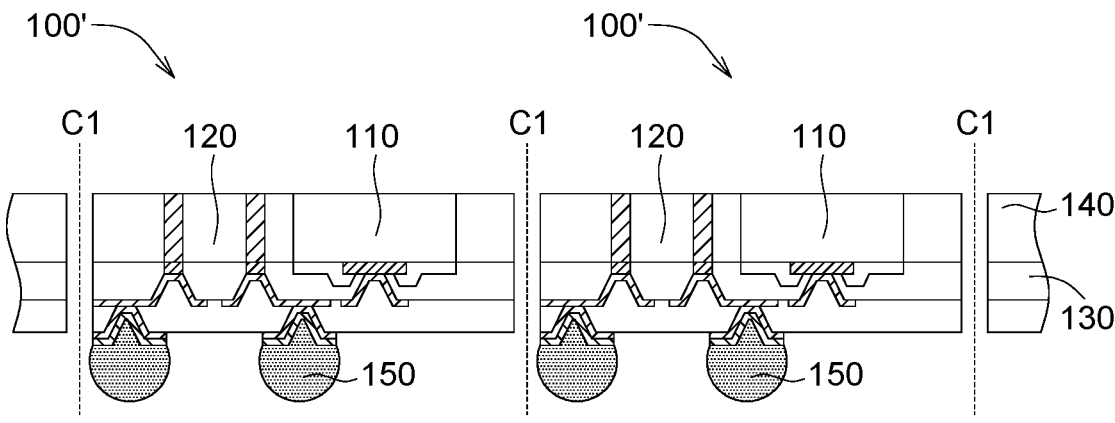
FIG. 12E
FIG. 12F

DIE PACKAGE INCLUDING A SEMICONDUCTOR DIE HAVING A CAVITY WITHIN WHICH A PASSIVE COMPONENT IS POSITIONED, IC PACKAGE AND MANUFACTURING PROCESS THEREOF

This application claims the benefit of U.S. provisional application Ser. No. 63/324,654, filed Mar. 29, 2022, the subject matter of which is incorporated herein by reference.

TECHNICAL FIELD

The disclosure relates in general to a die package, an IC package and manufacturing processes thereof.

BACKGROUND

Referring to FIGS. 1A to 1C, FIGS. 1A to 1C are schematic diagrams of a number of semiconductor packages 10, 11 and 30 of prior art.

As shown in FIG. 1A, traditional power regulation solutions need many discrete components externally supporting the processor SoC (system-on-chip) chip 11 which is typically flip chip bonded to a substrate for high-performance applications. In the traditional solutions, DC-DC power converters or regulators such as buck converters convert power from a high voltage to a low voltage for diverse microelectronics applications using power converter components including power management/control IC 12, power switches, large inductors 13 and bulky capacitors 14 mounted on a printed circuit board 15 at a large distance away from the processor SoC chip 11. This large distance consumes power from the power converter and creates significant power losses in the interconnect from the printed circuit board to the processor due to thermal conduction loss ($=I^2R$ where I is current and R is line resistance) and large AC impedance leading to dynamic changes in processor power consumption that requires power supply margins to ensure a high enough voltage for efficient operation of the processor.

As shown in FIGS. 1B and 1C regarding co-packaging of SoC chip 11 and DRAM 21 in a substrate based package, the package here can be an organic laminate substrate based BGA (ball grid array) package in the form of either side-by-side packaging as shown in FIG. 1B, or stacked-die packaging as shown in FIG. 1C wherein 22 stands for redistribution layers (RDL), 23 stands for cured "die attach" paste (DA) and 24 stands for die attach film (DAF). The package here can also be a lower cost metal leadframe substrate based QFP (quad flat pack) package. The RDL 22 in FIG. 1B is used to reroute central DRAM bonding pads to the DRAM die edge to shorten wire distances between DRAM and SoC for better performance.

Besides the packages shown in FIGS. 1A to 1C, package-on-package (PoP) is an additional conventional package that has the DRAM package mounted on top of the SoC package which, in turn, is mounted on the printed circuit board (PCB). Interconnection between the dies and between the bottom die and the laminate substrates is typically achieved using solder bonding. PoP is widely used to package application processors for cell phones. More often than not, laminate substrate rather than leadframe substrate is used in support of higher data rates even though leadframe based PoPs are also available commercially. However, PoP structures still faces the power loss and large AC impedance issues.

SUMMARY

According to an embodiment, a die package is provided. The die package includes a semiconductor die, a passive component, a molding compound and a RDL (redistribution layers). The semiconductor die includes a first bonding pad. The passive component includes a second bonding pad. The molding compound encloses the semiconductor die and the passive component. The RDL is disposed over the semiconductor die and the passive component and electrically connecting the first bonding pad with the second bonding pad. The semiconductor die is vertically overlapped with the passive component.

According to another embodiment, the first bonding pad of the semiconductor die is vertically overlapped with the second bonding pad of the passive component.

According to another embodiment, the die package further includes a spacer element under the passive component, such that a height of the semiconductor die is substantially the same as a sum of a height of the passive component and a height of the spacer element.

According to another embodiment, the passive component is a discrete capacitor, a discrete inductor, or a discrete resistor.

According to another embodiment, the passive component is the discrete inductor, and a conformal shield material is surrounded on at least a surface of the discrete inductor.

According to another embodiment, the die package further includes a heat spreader under the semiconductor die and the passive component, and the semiconductor die and the passive component are attached to the heat spreader through a thermal conducting die attach material.

According to another embodiment, a die package is provided. The die package includes a semiconductor die, a passive component, a molding compound and a RDL. The semiconductor die includes a first bonding pad. The passive component includes a second bonding pad. The molding compound encloses the semiconductor die and the passive component. The RDL is disposed over the semiconductor die and the passive component and electrically connecting the first bonding pad with the second bonding pad. The semiconductor die is horizontally overlapped with the passive component.

According to another embodiment, the molding compound includes a through mold via electrically connected to the second bonding pad and the RDL layer.

According to another embodiment, the semiconductor die is attached on the passive component.

According to another embodiment, the die package further includes another passive component over and bonded to the RDL layer.

According to another embodiment, the passive component is a discrete inductor, and a conformal shield material is surrounded on at least a surface of the discrete inductor.

According to another embodiment, the die package further includes a heat spreader under the semiconductor die and the passive component, and the semiconductor die and the passive component are attached to the heat spreader through a thermal conducting die attach material.

According to another embodiment, a die package is provided. The die package includes a semiconductor die, a passive component, a molding compound and a RDL. The semiconductor die includes a first bonding pad and a through silicon via in the semiconductor die. The passive component includes a second bonding pad. The molding compound encloses the semiconductor die. The RDL is disposed over the semiconductor die and electrically connecting with the first bonding pad. The semiconductor die has a cavity within which the passive component is positioned, and the second bonding pad is electrically connected with the through silicon via.

According to another embodiment, the cavity is located on a backside of the semiconductor die such that the through silicon via is revealed through the cavity.

According to another embodiment, the die package further includes an encapsulating material filled between walls of the cavity and the passive component.

According to another embodiment, the die package further includes a heat spreader under the semiconductor die and the passive component, and the semiconductor die and the passive component are attached to the heat spreader through a thermal conducting die attach material.

According to another embodiment, an IC package is provided. The IC package includes a die package as disclosed above and a semiconductor component. The semiconductor component is disposed under the die package.

According to another embodiment, the semiconductor component is a SoC chip, and the SoC chip is electrically connected to the die package through solder bumps.

According to another embodiment, the IC package further includes a laminated substrate under the SoC chip, and the SoC chip is electrically connected to the laminated substrate through wiring bonding or solder bonding.

According to another embodiment, the semiconductor component is a SoC chip, and the semiconductor die of the die package is a DRAM chip.

According to another embodiment, the semiconductor component is another die package described above.

According to another embodiment, the semiconductor die of the die package is a DRAM chip, and the semiconductor die of the semiconductor component is another DRAM chip.

According to another embodiment, another die package includes a through silicon via (TSV) or a through molding via (TMV).

According to another embodiment, the die package is directly bonded to the semiconductor component through a plurality of solder bumps.

According to another embodiment, a plurality of dummy bumps are positioned between the die package and the semiconductor component.

According to another embodiment, the die package and the semiconductor component are partially and vertically overlapped, and a supporting spacer is positioned under the die package and next to the semiconductor component.

According to another embodiment, a manufacturing process for a die package is provided. The manufacturing process includes the following steps: providing a semiconductor die including a first bonding pad and a passive component including a second bonding pad on a carrier, wherein the semiconductor die is vertically overlapped with the passive component; connecting the first bonding pad and the second bonding pad with a RDL; and forming a molding compound to enclose the semiconductor die and the passive component.

According to another embodiment, a manufacturing process for a die package is provided. The manufacturing process includes the following steps: providing a semiconductor die including a first bonding pad and a passive component including a second bonding pad on a carrier, wherein the semiconductor die is horizontally overlapped with the passive component; connecting the first bonding pad and the second bonding pad with a RDL; and forming a molding compound to enclose the semiconductor die and the passive component.

According to another embodiment, a manufacturing process for a die package is provided. The manufacturing process includes the following steps: providing a semiconductor die including a first bonding pad and a through silicon via on a carrier, wherein the semiconductor die has a cavity within which a passive component is positioned, and the passive component includes a second bonding pad electrically connected with the through silicon via; connecting the first bonding pad with a RDL; and forming a molding compound to enclose the semiconductor die.

The above and other aspects of the disclosure will become better understood with regard to the following detailed description of the preferred but non-limiting embodiment (s). The following description is made with reference to the accompanying drawings.

BRIEF DESCRIPTION OF THE DRAWINGS

FIGS. 12A to 12F are schematic diagrams of manufacturing processes according to the die package of FIG. 2B;

DETAILED DESCRIPTION

Figure 1A:
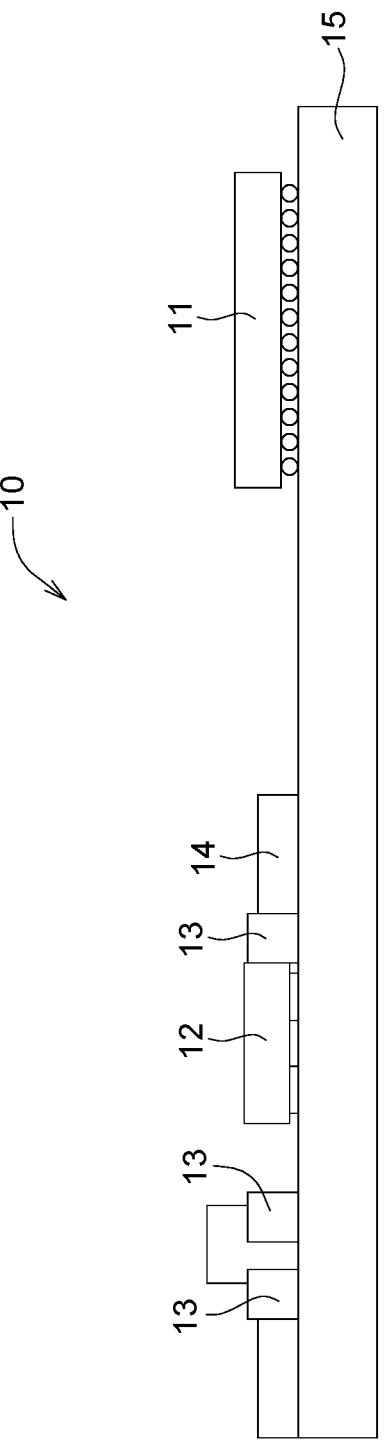
FIGS. 1A to 1C are schematic diagrams of a number of semiconductor packages of prior art.
Figure 1B:
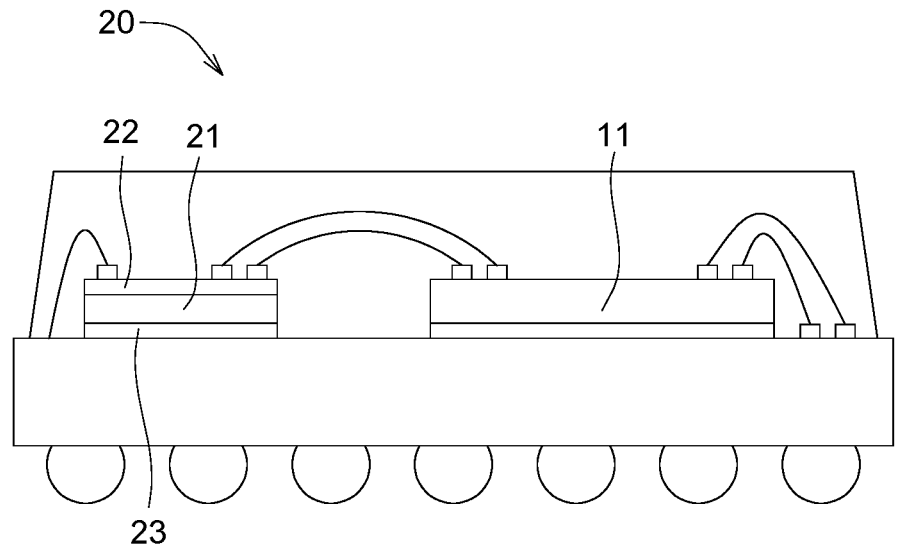
Figure 1C:
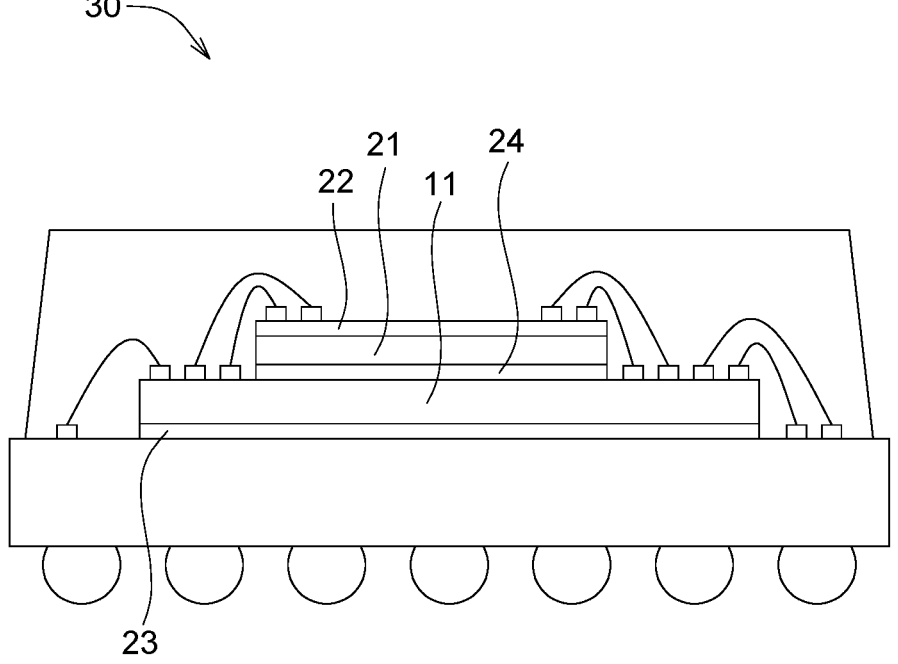
Figure 2A:
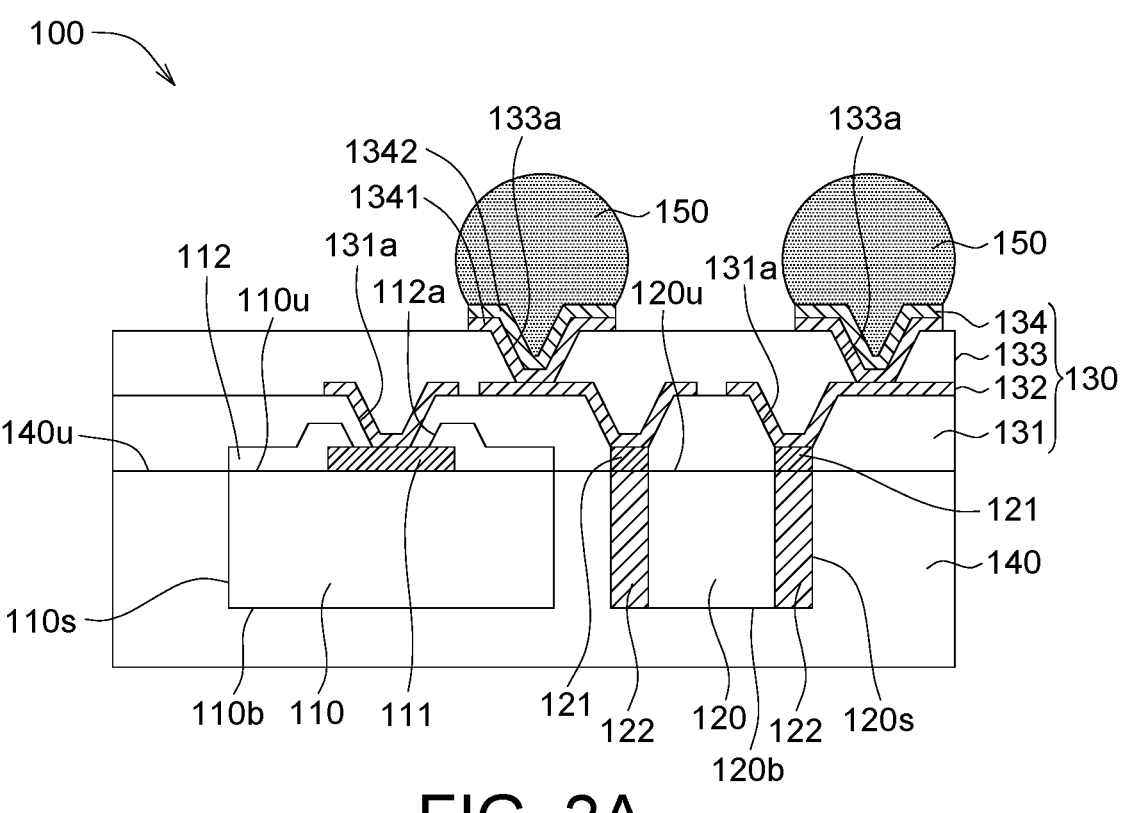
FIG. 2A is a schematic diagram of a die package according to an embodiment of the present disclosure.
Figure 2B:
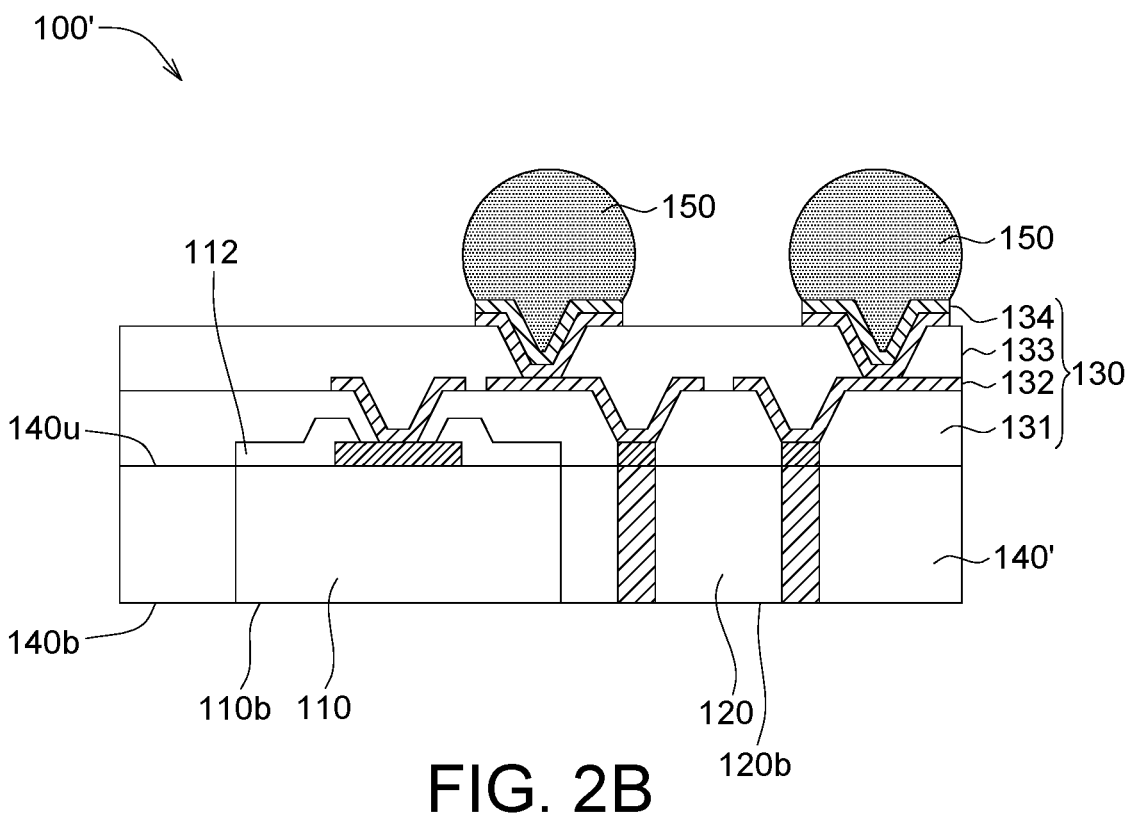
FIG. 2B is a schematic diagram of a die package according to another embodiment of the present disclosure.

FIG. 2A is a schematic diagram of a die package 100 according to an embodiment of the present disclosure, and FIG. 2B is a schematic diagram of a die package 100' according to another embodiment of the present disclosure.

As shown in FIG. 2A, the die package 100 includes at least one semiconductor die 110, at least one passive component 120, a RDL 130, a molding compound 140 and at least one contact 150. The semiconductor die 110 has at least one first bonding pad 111. The passive component 120 has at least one second bonding pad 121. The molding compound 140 encloses the semiconductor die 110 and the passive component 120. The RDL 130 is disposed over the semiconductor die 110 and the passive component 120. The RDL 130 electrically connects the first bonding pad 111 to the second bonding pad 121. The semiconductor die 110 is vertically overlapped with the passive component 120, since different horizontal lines perpendicular to a vertical axis (for example, z axis in the die or package thickness direction) pass through both the semiconductor die 110 and the passive component 120. In another view, the semiconductor die 110 is horizontally spaced apart from the passive component 120. In the RDL process, the passive component 120 could be disposed as close as possible to the semiconductor die 110, and accordingly noise could effectively be reduced and the dimensions (length, width and thickness) of the die package 100 could be significantly reduced.

In the present embodiment, the semiconductor die 110 could be, for example, DRAM, SoC chip, Power Management IC (PMIC), Integrated Voltage Regulator (IVR), etc.

As shown in FIG. 2A, the semiconductor die 110 further has a first surface 110*u*, a second surface 110*b* opposite to the first surface 110*u* and a first lateral surface 110*s*, and the passive component 120 has a first surface 120*u*, a second surface 120*b* opposite to the first surface 120*u* and a second lateral surface 120*s*. The molding compound 140 encloses (or encapsulates) the first lateral surface 110*s* of the semiconductor die 110 and the second lateral surface 120*s* of the passive component 120 and exposes the first surface 110*u* of the semiconductor die 110 and the first surface 120*u* of the passive component 120. The RDL 130 is formed on the first surface 110*u* and the first surface 120*u*.

As shown in FIG. 2A, the semiconductor die 110 further includes a passivation layer 112, and the passivation layer 112 has an opening 112*a* exposing the first bonding pad 111.

As shown in FIG. 2A, the passive component 120 is, for example, a discrete capacitor, a discrete inductor or a discrete resistor. The passive component 120 further includes at least one electrode 122. In one embodiment, the electrodes 122 are formed on two opposite lateral sides of the passive component 120. The two electrodes 122 are electrically connected to the two second bonding pads 121, respectively. The passive component 120 is electrically connected to the RDL 130 through the second bonding pads 121. In the present embodiment, the passive component 120 is, for example, a MLCC (Multi-layer Ceramic Capacitor).

As shown in FIG. 2A, the RDL 130 extends beyond the first lateral surface 110*s* of the semiconductor die 110 and the second lateral surface 120*s* of the passive component 120 to form a fan-out structure. The RDL 130 could include at least one dielectric layer 131, at least one conductive layer 132, at least one passivation layer 133 and at least one conductive pad 134. The dielectric layer 131 is formed on the molding compound 140 and has a number of openings 131*a* exposing the first bonding pad 111 of the semiconductor die 110. The conductive layer 132 is formed on the dielectric layer 131 and laterally extends beyond the first lateral surface 110*s* of the semiconductor die 110 and the second lateral surface 120*s* of the passive component 120. The conductive layer 132 further extends to the openings 131*a* to electrically connect the semiconductor die 110 with the passive component 120. The passivation layer 133 covers the conductive layer 132 and has at least one lower opening 133*a* exposing the conductive layer 132. Each conductive pad 134 is formed within the corresponding opening 133*a* for electrically connected to the conductive layer 132 through the corresponding opening 133*a*. In addition, the conductive pad 134 includes a first layer 1341 and a second layer 1342, wherein the first layer is formed of materials including, for example, titanium, titanium/tungsten, or nickel-vanadium and the second layer is formed of materials including, for example, copper, nickel, palladium, gold or combinations thereof. The conductive pads 134 are configured for wire-bonding or flip chip assembly.

As shown in FIG. 2A, the contacts 150 are, for example, solder balls, conductive pillars, conductive bumps, etc. Each contact 150 is formed on the corresponding conductive pad 134. In another embodiment, the contacts 150 could be micro-pillars or micro-metal-pads, and accordingly the sizes of the contact 150 could be increased or decreased.

As shown in FIG. 2A, the molding compound 140 could be formed of an epoxy, a resin, a moldable polymer, or the like. The molding compound 140 could be applied while substantially liquid, and then could be cured through a chemical reaction, such as in an epoxy or resin. In some other embodiments, the molding compound 140 could be an ultraviolet (UV) or thermally cured polymer applied as a gel or malleable solid capable of being disposed around the semiconductor die, and then may be cured through a UV or thermal curing process. The molding compound 140 could be formed by various packaging technologies, such as, for example, compression molding, injection molding or transfer molding.

As shown in FIG. 2A, the first surface 140*u*, the first surface 110*u* and the first surface 120*u* are substantially aligned with (for example, flush) with each other. In addition, the molding compound 140 further covers the second surface 110*b* of the semiconductor die 110 and the second surface 120*b* of the passive component 120. However, such exemplification is not meant to be limiting.

As shown in FIG. 2B, the die package 100' includes at least one semiconductor die 110, at least one passive component 120, the RDL 130, an molding compound 140' and at least one contact 150. The die package 100' includes the features similar to or the same as that of the die package 100 except that the molding compound 140' exposes the second surface 110*b* of the semiconductor die 110 and the second surface 120*b* of the passive component 120. The molding compound 140' has a second surface 140*b* opposite to the first surface 140*u*, wherein the second surface 110*b*, the second surface 120*b* and the second surface 140*b* are substantially aligned with (for example, flush) with each other by a grinding process.

Figure 3:
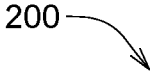
FIG. 3 is a schematic diagram of a die package according to another embodiment of the present disclosure.
Figure 3:
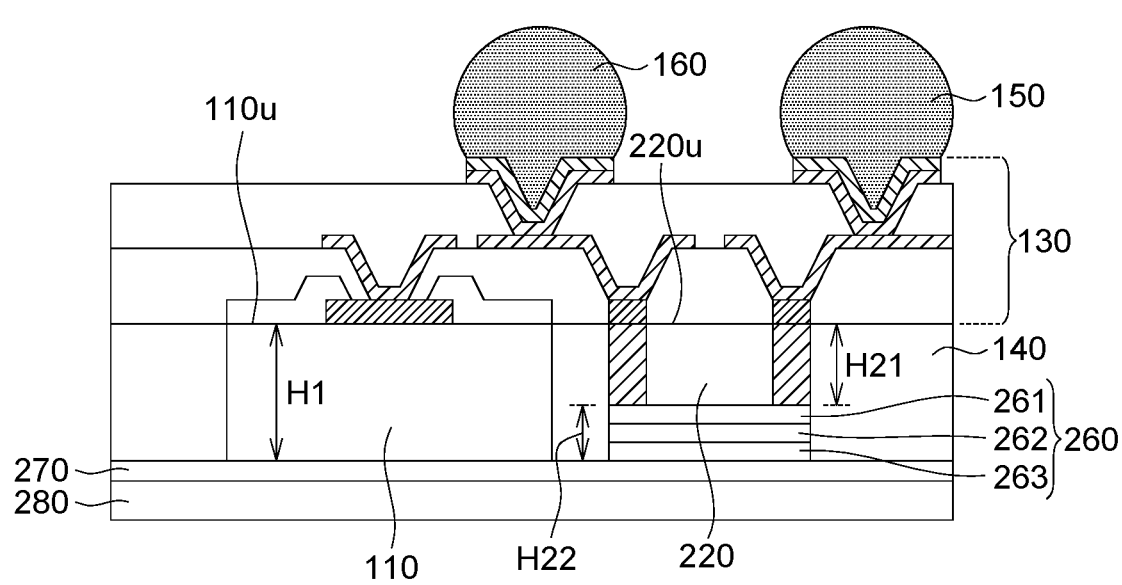

FIG. 3 is a schematic diagram of a die package 200 according to another embodiment of the present disclosure.

As shown in FIG. 3, the die package 200 includes at least one semiconductor die 110, at least one passive component 220, the RDL 130, the molding compound 140, at least one contact 150, a spacer element 260, a release layer 270 and a carrier 280. The die package 200 includes the features similar to or the same as that of the die package 100 except that the passive component 220 and the semiconductor die 110 are different in height, and the die package 200 further includes the spacer element 260, the release layer 270 and the carrier 280.

As shown in FIG. 3, the spacer element 260 is disposed under the passive component 220 for raising the height of the passive component 220 such that the first surface 110*u* of the semiconductor die 110 and a first surface 220*u* of the passive component 220 are at the same level. Furthermore, a height H1 of the semiconductor die 110 is substantially the same as the sum of a height H21 of the passive component 220 and a height H22 of the spacer element 260. In an embodiment, the spacer element 260 includes, for example, a die attach film 261, a spacer 262 and a die attach film 263, wherein the spacer 262 is disposed between the die attach film 261 and the die attach film 263.

As shown in FIG. 3, the release layer 270 is disposed between the carrier 280 and the molding compound 140. The release layer 270 is, for example, a release layer or a release/adhesive layer. The carrier 280 is, for example, a glass carrier.

Figure 4:
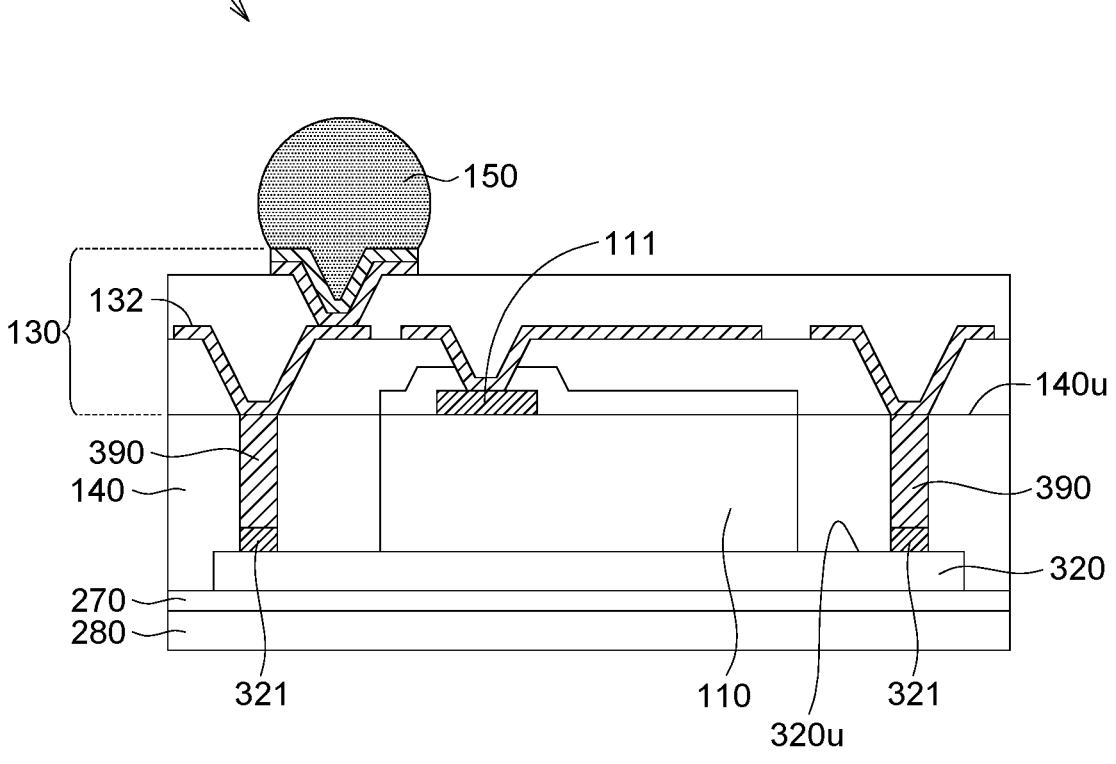
FIG. 4 is a schematic diagram of a die package according to another embodiment of the present disclosure.

FIG. 4 is a schematic diagram of a die package 300 according to another embodiment of the present disclosure.

As shown in FIG. 4, the die package 300 includes at least one semiconductor die 110, at least one passive component 320, the RDL 130, the molding compound 140, at least one contact 150, the release layer 270, the carrier 280 and at least one conductive via 390. The die package 300 includes the features similar to or the same as that of the die package 100 except that the passive component 320 (shown in FIG. 4) and the passive component 120 (shown in FIG. 2A) are different and the die package 300 further includes at least one conductive via 390.

As shown in FIG. 4, the semiconductor die 110 is attached on the passive component 320. The semiconductor die 110 is horizontally overlapped with the passive component 320, since different vertical lines which are perpendicular to a horizontal axis (for example, x axis) pass through both the semiconductor die 110 and the passive component 320. In another view, the semiconductor die 110 is vertically spaced apart from the passive component 320.

As shown in FIG. 4, the passive component 320 is, for example, a discrete inductor. The passive component 320 includes at least one second bonding pad 321 and has a first surface 320u. The second bonding pads 321 are formed on the first surface 320u and protrude relative to the first surface 320u.

As shown in FIG. 4, each conductive via 390 is, for example, Through Mold Via (TMV). Each conductive via 390 extends to the passive component 320 from the first surface 140u. A number of the conductive vias 390 electrically connect the second bonding pads 321 and the RDL 130. The RDL 130 is formed on the first surface 140u of the molding compound 140 and the semiconductor die 110 and electrically connected to the conductive vias 390 and the first bonding pads 111 of the semiconductor die 110 by the conductive layer 132 of the RDL 130. The semiconductor die 110 and the passive component 320 are electrically connected through the RDL 130 and the conductive vias 390.

In another embodiment, the die package 300 further includes a conformal shield material (not shown) surrounding at least a surface of the passive component 320.

In another embodiment, the die package 300 further includes a heat spreader (not shown) under the semiconductor die 110 and the passive component 320, wherein the semiconductor die 110 and the passive component 320 are attached to the heat spreader through at least a thermally conducting die attach material (not shown).

Figure 5:
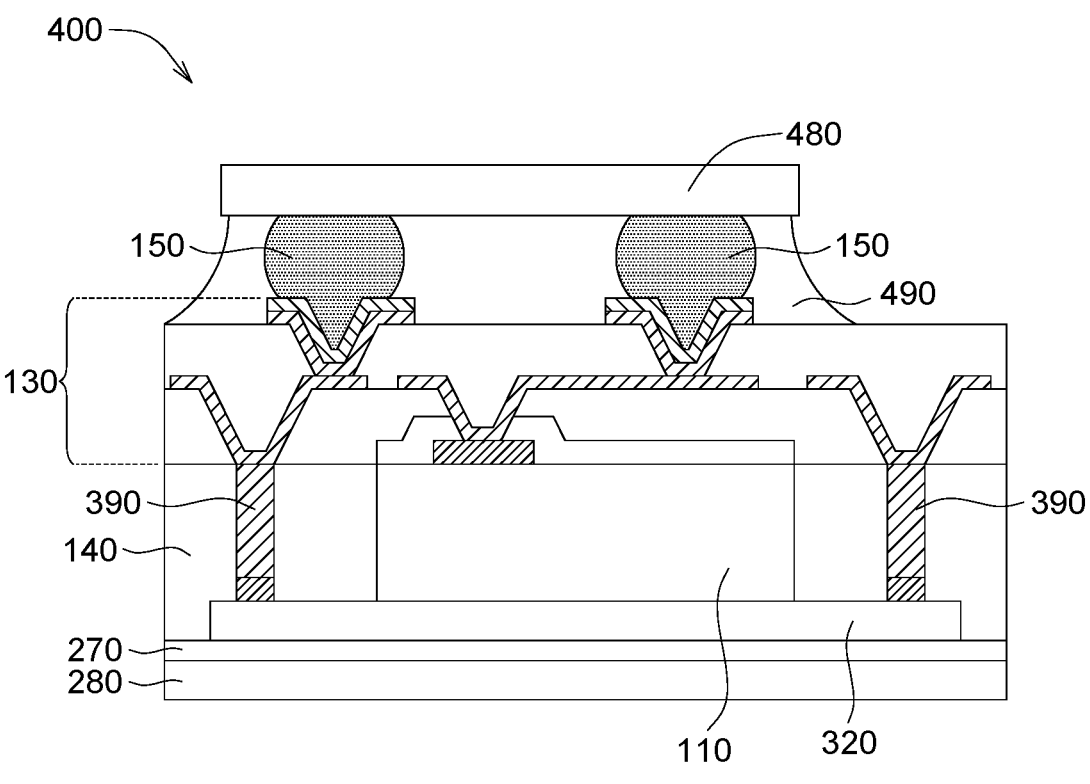
FIG. 5 is a schematic diagram of a die package according to another embodiment of the present disclosure.

FIG. 5 is a schematic diagram of a die package 400 according to another embodiment of the present disclosure.

As shown in FIG. 5, the die package 400 includes at least one semiconductor die 110, at least one passive component 320, the RDL 130, the molding compound 140, at least one contact 150, the release layer 270, the carrier 280, at least one conductive via 390, at least one electronic component 480 and a underfill 490. The die package 400 includes the features similar to or the same as that of the die package 300 except that the die package 400 further includes at least one electronic component 480 and the underfill 490. With the die facing up (see FIG. 12), the passive component 320 is first bonded to the release layer 270 and then the semiconductor die 110 is attached to the passive component 320. The conductive via 390 is formed after molding and mold grinding by laser via hole formation, titanium/copper seed layer deposition, copper electroplating, and via hole plugging by a polymer and a conductive material such as a solder.

As shown in FIG. 5, the electronic component 480 is, for example, another passive component or an active chip. The electronic component 480 is bonded to the RDL 130 through at least one contact 150. The underfill 490 is formed between the electronic component 480 and the RDL 130 and encapsulates the contacts 150 for protecting the contacts 150.

In another embodiment, the die package 400 further includes a conformal shield material (not shown) surrounding at least a surface of the passive component 320.

In another embodiment, the die package 400 further includes a heat spreader (not shown) under the semiconductor die 110 and the passive component 320, wherein the semiconductor die 110 and the passive component 320 are attached to the heat spreader through a thermally conducting die attach material (not shown).

Figure 6:
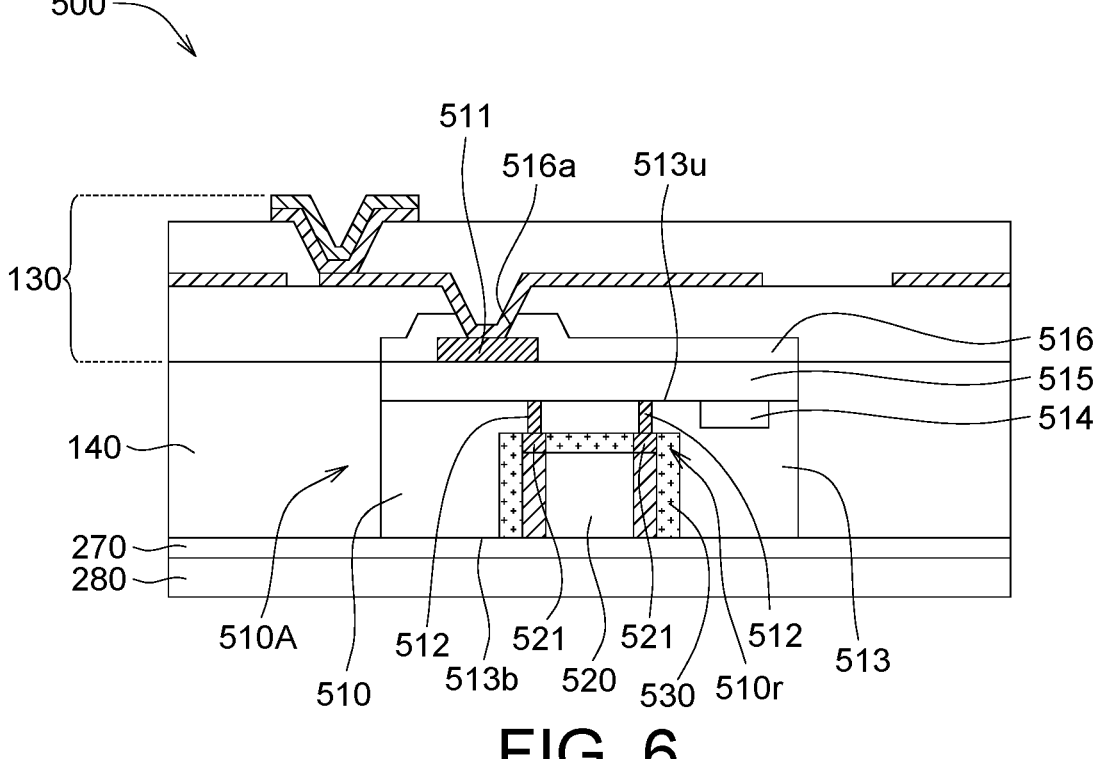
FIG. 6 is a schematic diagram of a die package according to another embodiment of the present disclosure.

FIG. 6 is a schematic diagram of a die package 500 according to another embodiment of the present disclosure. The die package 500 includes at least one semiconductor die 510, at least one passive component 520, the RDL 130, the molding compound 140, the release layer 270 and the carrier 280. The die package 500 includes the features similar to or the same as that of the die package 200 except that the semiconductor die 510 and the passive component 520 are integrated into one piece. As a result, the passive component 520 could be disposed as close as possible to the semiconductor die 510, and accordingly noise could effectively be reduced and the dimensions (length, width and thickness) of the die package 500 could be significantly reduced.

As shown in FIG. 6, the semiconductor die 510 includes at least one first bonding pad 511 and at least one conductive via 512 in the semiconductor die 510. The passive component 520 includes at least one second bonding pad 521. The molding compound 140 encloses the semiconductor die 510. The RDL 130 is disposed over the semiconductor die 510 and is electrically connected to the first bonding pad 511. The semiconductor die 510 has a cavity 510r within which the passive component 520 is positioned, and the second bonding pad 521 is electrically connected to the conductive via 512.

The conductive via 512 is, for example, Through Silicon Via (TSV). The semiconductor die 510 further includes a silicon substrate 513, a Front-End-of-the-Line (FEOL) layer 514 a Back-End-of-the-Line (BEOL) layer 515 and a passivation layer 516. The conductive via 512 could extend from the BEOL layer 515 to the cavity 510r for electrically connecting the passive component 520 to the BEOL layer 515. The silicon substrate 513 has a first surface 513u and a second surface 513b opposite to the first surface 513u. The BEOL layer 515 and the FEOL layer 514 are formed on and within the silicon substrate 513. The passivation layer 516 covers the BEOL layer 515 and has at least one opening 516a to expose the first bonding pad 511.

As shown in FIG. 6, the cavity 510r is located on the backside of the semiconductor die 510 such that the conductive via 512 is revealed through the cavity 510r. Furthermore, the cavity 510r extends from the second surface 513b towards the first surface 513u, but not all the way to the first surface 513u.

As shown in FIG. 6, the die package 500 further includes an encapsulating material 530 filled between walls of the cavity 510r and the passive component 520.

In another embodiment, the die package 500 further includes a heat spreader (not shown) under the passive component 320, wherein the passive component 320 is attached to the heat spreader through a thermal conducting die attach material (not shown).

Figure 7:
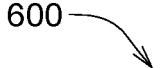
FIG. 7 is a schematic diagram of an IC package according to another embodiment of the present disclosure.
Figure 7:
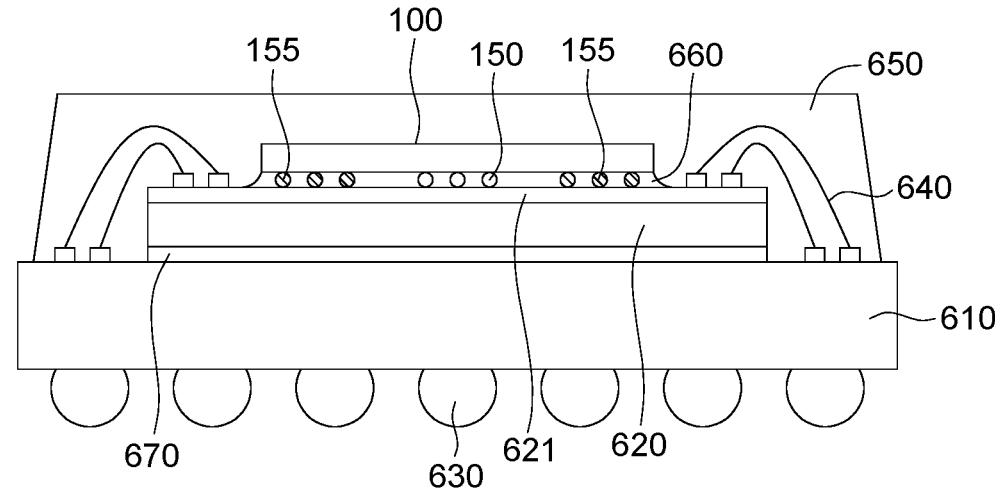

FIG. 7 is a schematic diagram of an IC package 600 according to another embodiment of the present disclosure.

The IC package 600 includes the die package 100, a substrate 610, a semiconductor component 620, at least one contact 630, at least one metal wire 640, an molding compound 650, an underfill 660, and a die attach (DA) 670. The semiconductor component 620 is disposed under the die package 100. In another embodiment, either the die package 100 or the semiconductor component 620 could be any one of the die packages 200 to 500.

The substrate 610 is, for example, a laminated substrate. The substrate 610 is disposed under the semiconductor component 620, and the semiconductor component 620 is electrically connected to the substrate 610 through at least one metal wire 640.

As shown in FIG. 7, the semiconductor component 620 is, for example, DRAM, SoC chip, etc. The semiconductor component 620 is electrically connected to the die package 100 through at least one contact 150 (for example solder bump). The semiconductor die (not shown) of the die package 100 is, for example, a DRAM chip.

As shown in FIG. 7, the semiconductor component 620 is disposed on the substrate 610 through the die attach 670, and electrically connected to the substrate 610 through the metal wires 640. The die package 100 is disposed on and electrically connected to the semiconductor component 620 through the contacts 150. Furthermore, the semiconductor component 620 includes a RDL 621, and the die package 100 is electrically connected to the RDL 621 of the semiconductor component through the contacts 150. In the present embodiment, the die package 100 further includes at least one dummy solder bump 155 which is disposed between the die package 100 and the semiconductor component 620. The dummy solder bump 155 could enhance the joint yield and reliability when the die package 100 is stacked on the semiconductor component 620.

As shown in FIG. 7, the underfill 660 is formed between the die package 100 and the semiconductor component 620 and encapsulates the contacts 150. The molding compound 650 is formed on the substrate 610 and encapsulates the die package 100, the semiconductor component 620, the metal wire 640 and the underfill 660. In another embodiment, either the die package 100 or the semiconductor component 720 could be any one of the die packages 100 to 500.

Figure 8:
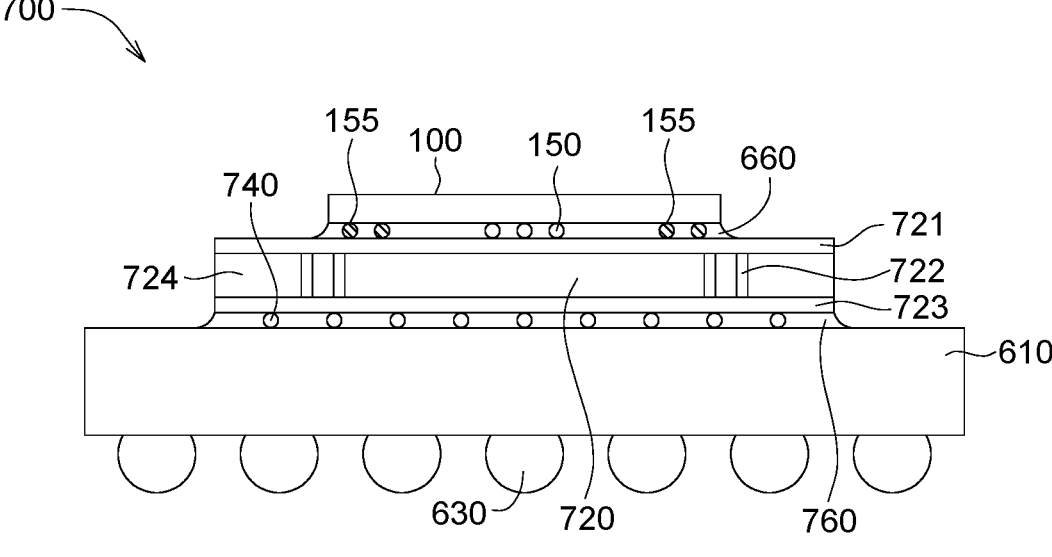
FIG. 8 is a schematic diagram of an IC package according to another embodiment of the present disclosure.

Referring to FIG. 8, FIG. 8 is a schematic diagram of an IC package 700 according to another embodiment of the present disclosure.

The IC package 700 includes the substrate 610, the semiconductor component 720, at least one contact 630, at least one solder bump 740, the underfill 660, the underfill 760 and the die package 100. In another embodiment, either the die package 100 or the semiconductor component 720 could be any one of the die packages 100 to 500.

The semiconductor component 720 is, for example, DRAM, SoC chip, etc. The semiconductor component 720 is disposed on and electrically connected to the substrate 610 through the solder bumps 740. Furthermore, the semiconductor component 720 includes a first RDL 721, at least one conductive through via 722, a second RDL 723 and a substrate 724. The first RDL 721 and the second RDL 723 are formed on opposite two sides of the substrate 724 and electrically connected with each other through the conductive vias 722. The conductive via 722 is, for example, TSV. The second RDL 723 is electrically connected to the solder bumps 740, such that the semiconductor component 720 is electrically connected to the substrate 610 through the second RDL 723. The die package 100 is disposed on and electrically connected to the semiconductor component 720 through the contacts 150. The underfill 760 is formed between the semiconductor component 720 and the substrate 610 and encapsulates the solder bumps 740.

Figure 9:
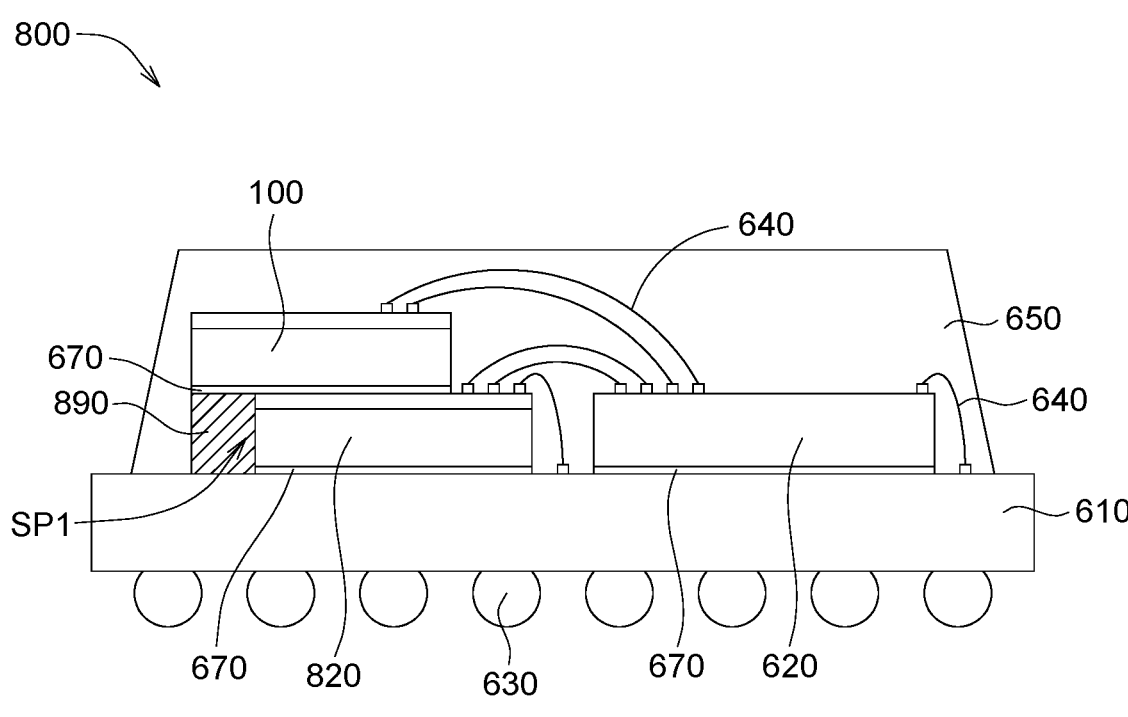
FIG. 9 is a schematic diagram of an IC package according to another embodiment of the present disclosure.

FIG. 9 is a schematic diagram of an IC package 800 according to another embodiment of the present disclosure.

The IC package 800 includes the substrate 610, the semiconductor component 620, at least one contact 630, at least one metal wire 640, the molding compound 650, at least one die attach 670, a semiconductor component 820, a spacer 890 and the die package 100. In another embodiment, the die package 100, the semiconductor component 620 and the semiconductor component 820 could be replaced by one of the die packages 100 to 500.

The semiconductor component 820 is, for example, another die package, for example, one of the die packages 100 to 500. The die package 100 and the semiconductor component 820 allow doubling of the storage capacity when the semiconductor die 110 (not shown) of the die package 100 is a DRAM chip, and the semiconductor die 110 (not shown) of the semiconductor component 820 is another DRAM chip.

The die package 100 is electrically connected to the semiconductor component 620 (or with the substrate 610) through the metal bonding wire 640, and the semiconductor component 820 is electrically connected with the substrate 610 and/or the semiconductor component 620 through the bonding wire 640. The semiconductor component 820 is disposed under the die package 100. The die package 100 and the semiconductor component 820 are shifted in the x-y plane and there is a space SP1 formed below the substrate 610 and the die package 100. The spacer 890 is disposed within the space SP1 to support the die package 100 using die attach materials. As a result, it could prevent the die package 100 from shifting when the metal wire 640 is bonded to the die package 100.

Figure 10:
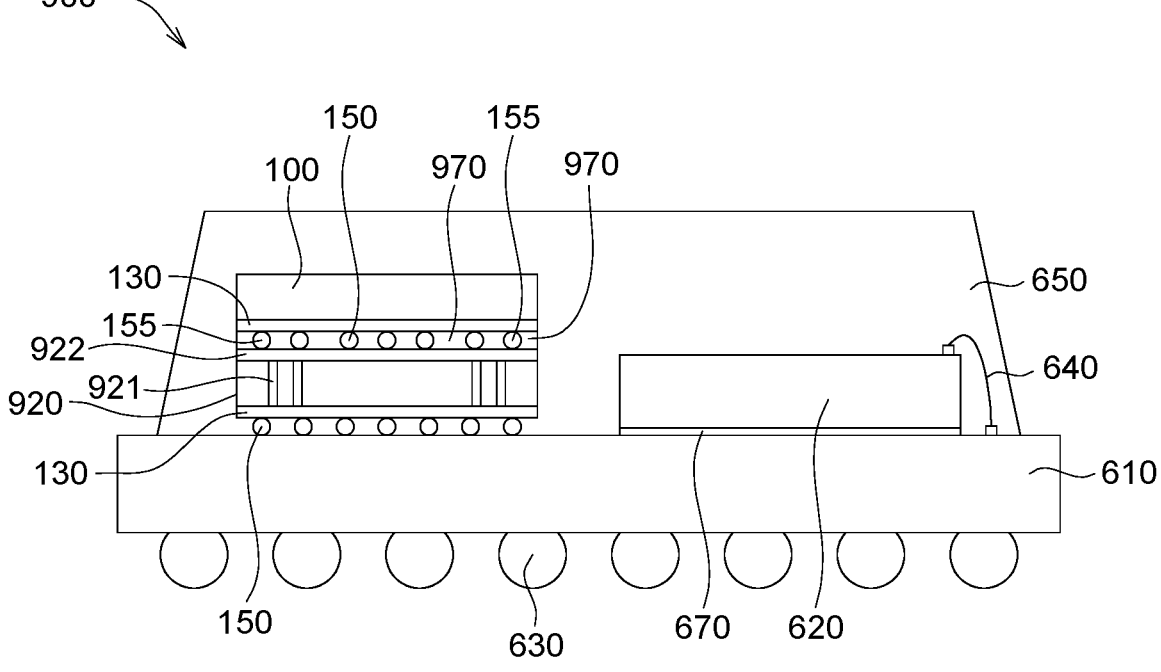
FIG. 10 is a schematic diagram of an IC package according to another embodiment of the present disclosure.

FIG. 10 is a schematic diagram of an IC package 900 according to another embodiment of the present disclosure.

The IC package 900 includes the substrate 610, the semiconductor component 620, at least one contact 630, at least one bonding wire 640, the molding compound 650, at least one die attach 670, the underfill 970, the die package 100 and a semiconductor component 920. In another embodiment, the die package 100, the semiconductor component 620 and/or semiconductor component 920 could be replaced by one of the die packages 100 to 500.

The die package 100 and/or semiconductor component 920 could be a DRAM chip and a passive component in one as shown in the die packages 100 to 500. Thus, the die package 100 and the semiconductor component 920 allows doubling of the storage capacity when the semiconductor die (not shown) of the die package 100 is a DRAM chip, and the semiconductor die (not shown) of the semiconductor component 920 is another DRAM chip.

The die package 100 is disposed on the semiconductor component 920 through the contact 150 of the die package 100. The underfill 970 is formed between the die package 100 and the semiconductor component 920 and encapsulates the contacts 150. The semiconductor component 920 includes the features similar to or the same as that of the die package 100 except that the semiconductor component 920 further includes at least one conductive via 921 and a RDL 922, wherein the conductive via 921 can extend to the RDL 130 from the RDL 922. The conductive via 921 is, for example, TSV or TMV. The die package 100 and the semiconductor component 920 are electrically connected with each other. For example, the RDL 130 of the die package 100 is electrically connected with the RDL 922 of the semiconductor component 920. The die package 100 is directly bonded to the semiconductor component 920 through at least one contact 150 (for example, solder bump). In addition, at least one dummy solder bump 155 is positioned between the die package 100 and the semiconductor component 920.

FIGS. 11A to 11F show schematic diagrams of manufacturing processes leading to the die package 100 of FIG. 2A. In the present embodiment, the process is called "chip-first" process with die facing down.

Figure 11A:
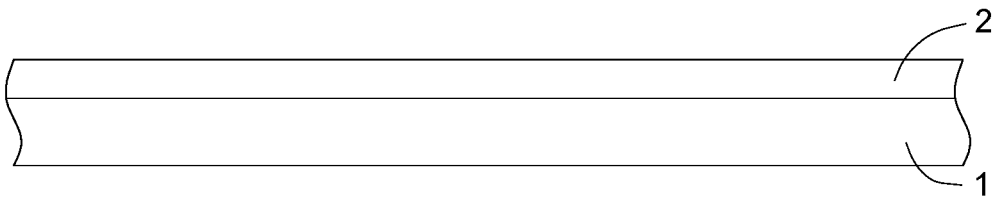
FIGS. 11A to 11F are schematic diagrams of manufacturing processes according to the die package of FIG. 2A.

As shown in FIG. 11A, a carrier 1 on which the release layer 2 is disposed is provided.

Figure 11B:
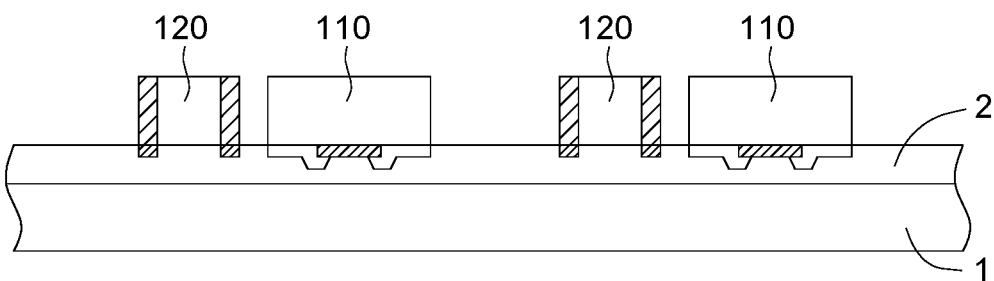

As shown in FIG. 11B, at least one semiconductor die 110 and at least one passive component 120 are disposed on the carrier 1 through the release layer 2. In the present embodiment, the semiconductor die 110 is coupled to the release 2 in a "face-down" orientation.

Figure 11C:
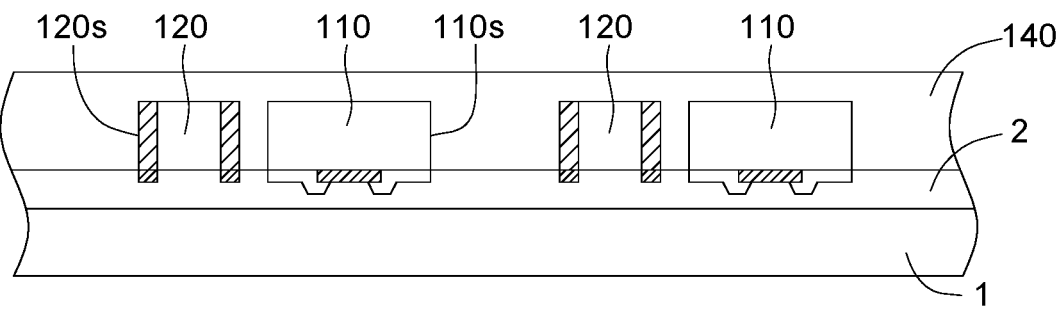

As shown in FIG. 11C, the molding compound 140 encapsulating the first lateral surface of the semiconductor die 110 and the second lateral surface of the passive component 120 is formed on the carrier.

Figure 11D:
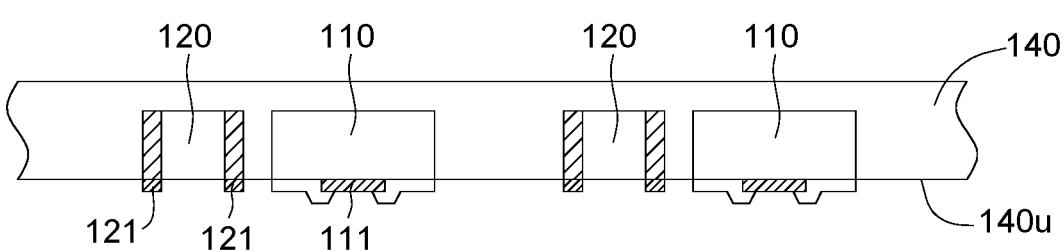

As shown in FIG. 11D, the carrier 1 and the release layer 2 are removed to expose the first bonding pad 111 of the semiconductor die 110, the second bonding pad 121 of the passive component 120 and the first surface 140$u$ of the molding compound 140.

Figure 11E:
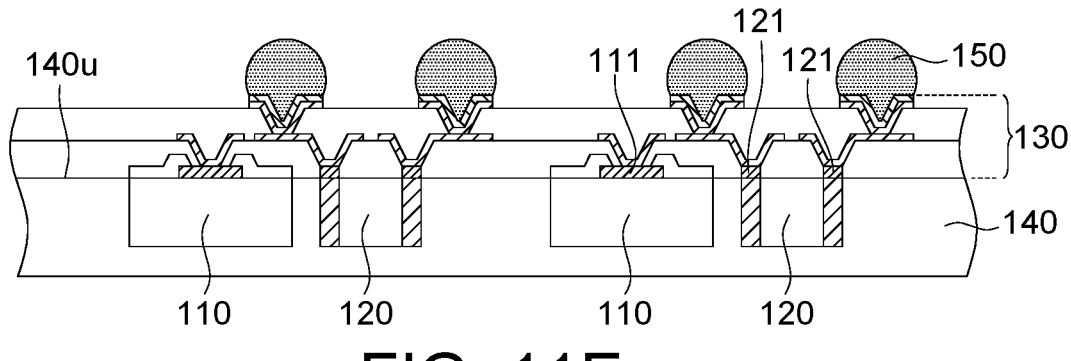

As shown in FIG. 11E, the RDL 130 electrically connecting the exposed first bonding pad 111 with the exposed second bonding pad 121 is formed on the surface 140$u$ of the molding compound 140. Then, at least one contact 150 is formed on the RDL 130.

Figure 11F:
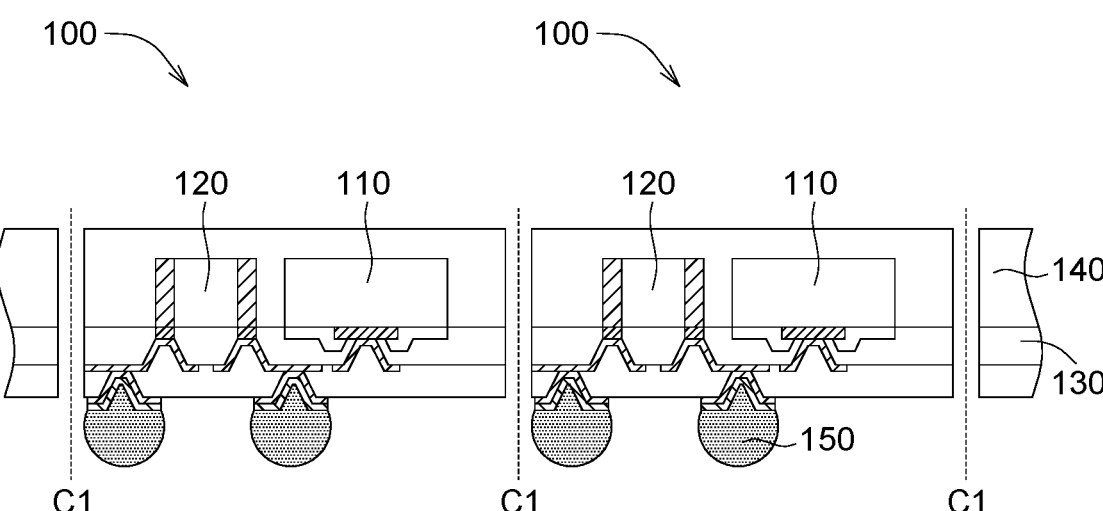

As shown in FIG. 11F, a number of singulation path C1 passing through the molding compound 140 and the RDL 130 are formed to create at least one die package 100. The singulation paths C1 are formed using an appropriate dicing tool.

Referring to FIGS. 12A to 12F, FIGS. 12A to 12F are schematic diagrams of manufacturing processes leading to the die package 100' of FIG. 2B. In the present embodiment, the process is called "chip-first" process with die facing up.

As shown in FIG. 12A, a carrier 1 on which the release 2 is disposed is provided.

As shown in FIG. 12B, at least one semiconductor die 110 and at least one passive component 120 are disposed on the carrier 1 through the release layer 2. In the present embodiment, the semiconductor die 110 is coupled to the release layer 2 in a "face-up" orientation.

As shown in FIG. 12C, the molding compound 140 encapsulating the first lateral surface of the semiconductor die 110 and the second lateral surface of the passive component 120 is formed on the carrier.

As shown in FIG. 12D, the RDL 130 electrically connecting the exposed first bonding pad 111 with the exposed second bonding pad 121 is formed on the surface 140$u$ of the molding compound 140.

As shown in FIG. 12E, at least one contact 150 is formed on the RDL 130.

As shown in FIG. 12F, after removing the carrier 1, a number of singulation path C1 passing through the molding compound 140 and the RDL 130 are formed to form at least one die package 100'. The singulation paths C1 are formed using an appropriate dicing tool.

FIGS. 13A to 13F are schematic diagrams of manufacturing processes leading to the die package 100 of FIG. 2A. In the present embodiment, the process is called "chip-last" process with die facing down.

Figure 13A:
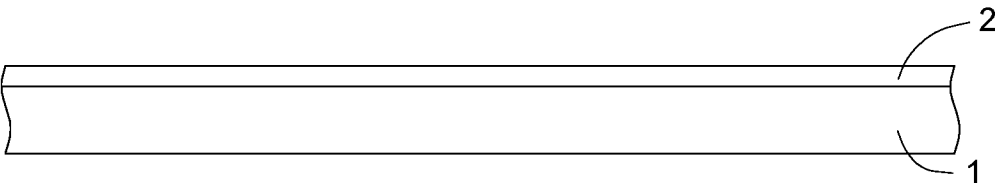
FIGS. 13A to 13F are schematic diagrams of manufacturing processes according to the die package of FIG. 2A.

As shown in FIG. 13A, the carrier 1 on which the release layer 2 is disposed is provided.

Figure 13B:
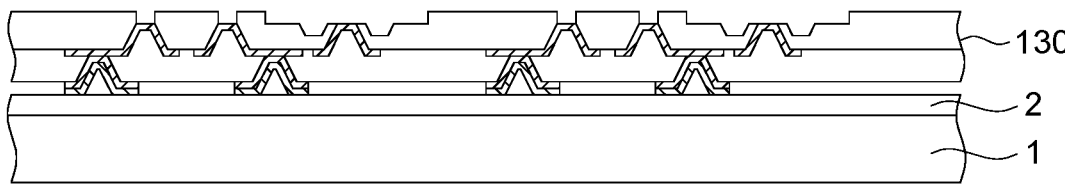

As shown in FIG. 13B, the RDL 130 is formed on the carrier 1 through the release layer 2. In the present process, the RDL 130 is, for example, a polyimide/copper based RDL film.

Figure 13C:
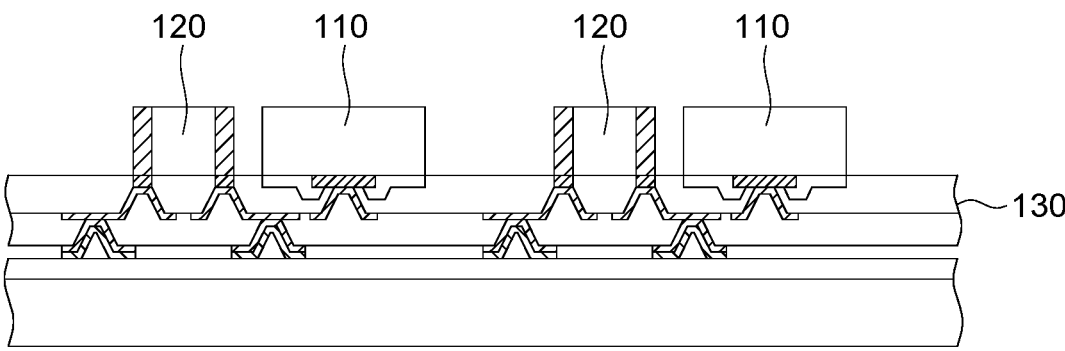

As shown in FIG. 13C, at least one semiconductor die 110 and at least one passive component 120 are bonded to the RDL 130 using, for example, solder bumps with an underfill. In the present embodiment, the semiconductor die 110 is coupled to the RDL 130 in a "face-down" orientation.

Figure 13D:
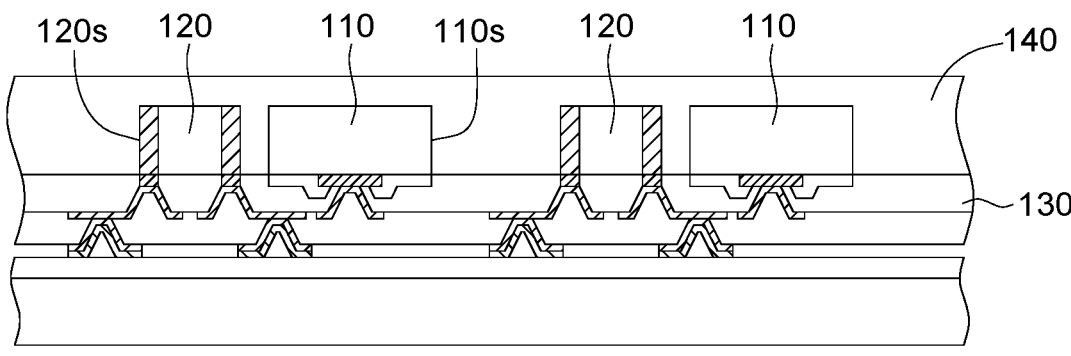

As shown in FIG. 13D, the molding compound 140 encapsulating the first lateral surface of the semiconductor die 110 and the second lateral surface of the passive component 120 is formed on the RDL 130.

Figure 13E:
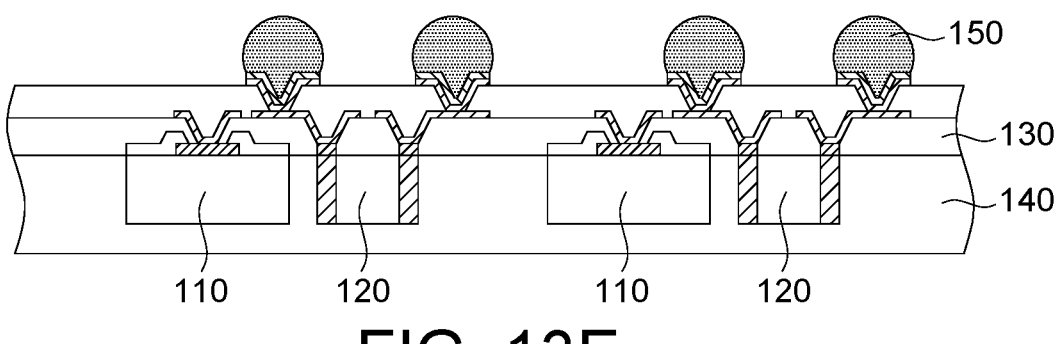

As shown in FIG. 13E, the carrier 1 and the release layer 2 are removed to expose the RDL 130. Then, at least one contact 150 is formed on the exposed RDL 130.

Figure 13F:
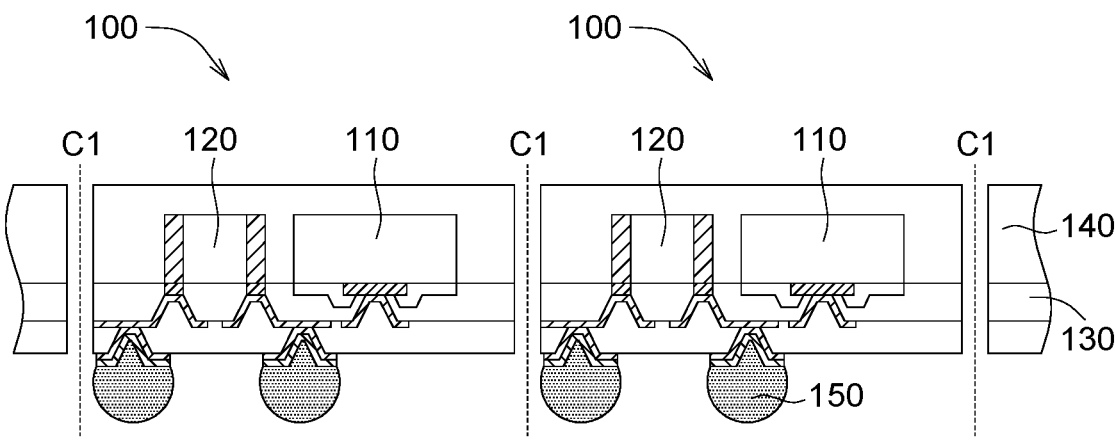

As shown in FIG. 13F, a number of singulation path C1 passing through the molding compound 140 and the RDL 130 are formed to create at least one die package 100. The singulation paths C1 are formed using an appropriate dicing tool.

The manufacturing processes of die packages 200 to 500 are similar to the process of the die package 100, and are not repeated here due to similarities.

FIGS. 14A to 14G are schematic diagrams of manufacturing processes of the semiconductor die 510 and the passive component 520 of FIG. 6 which are integrated into one piece according to an embodiment.

Figure 14A:
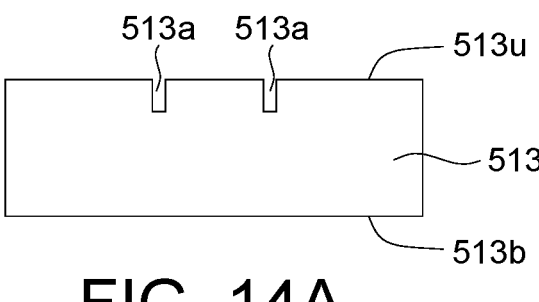
FIGS. 14A to 14G are schematic diagrams of manufacturing processes of the semiconductor die and the passive component which are integrated into one piece as shown in FIG. 6 according to an embodiment; and In the following detailed description, for purposes of explanation, numerous specific details are set forth in order to provide a thorough understanding of the disclosed embodiments. It will be apparent, however, that one or more embodiments could be practiced without these specific details. In other instances, well-known structures and devices are schematically shown in order to simplify the drawing.

As shown in FIG. 14A, the silicon substrate 513 having at least one hole 513$a$ is provided. The silicon substrate 513 is, for example, a wafer. The silicon substrate 513 has the first surface 513$u$ and the second surface 513$b$ opposite to the first surface 513$u$. Each hole 513$a$ extends from the first surface 513$u$ towards the second surface 513$b$, but not all the way to the second surface 513$b$. Each hole 513$a$ is, for example, a blind hole.

Figure 14B:
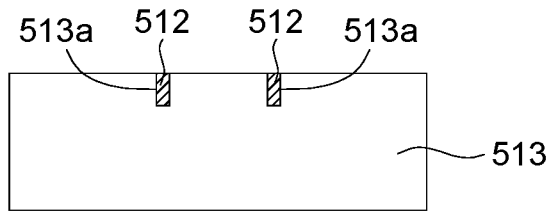

As shown in FIG. 14B, the hole 513$a$ is filled with a conductive material to form the conductive via 512.

Figure 14C:
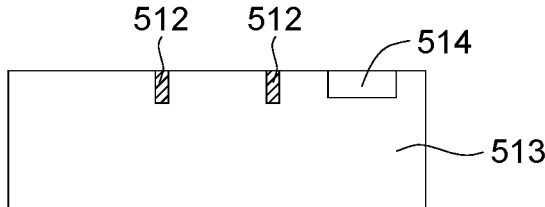

As shown in FIG. 14C, the FEOL layer 514 is formed within the silicon substrate 513.

Figure 14D:
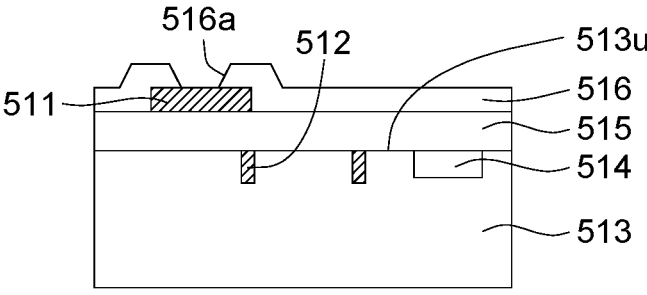

As shown in FIG. 14D, the FEOL layer 514 is formed on the first surface 513$u$ of the silicon substrate 513 and the BEOL layer 515 is formed to be coupled to the conductive via 512, and then at least one first bonding pad 511 is formed on the BEOL layer 515. Then, the passivation layer 516 is formed on the first surface 513$u$ and has at least one opening 516$a$ to expose the corresponding first bonding pad 511.

Figure 14E:
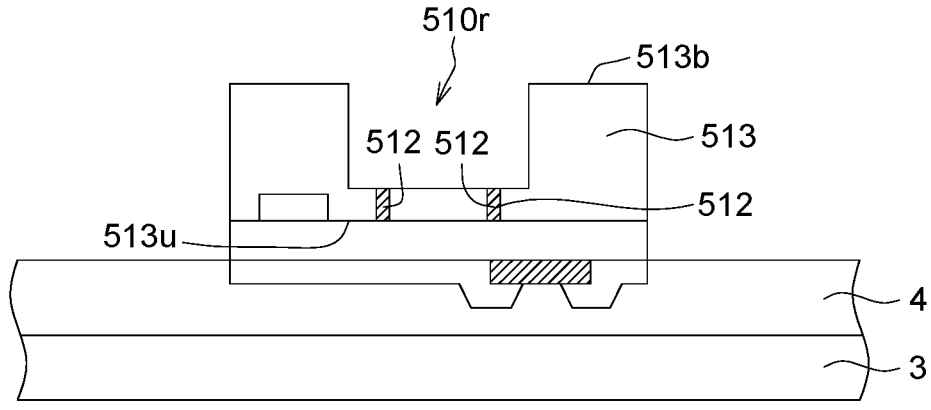

As shown in FIG. 14E, the structure of FIG. 14D is disposed on a carrier 3 through a release layer 4, and then the cavity 510$r$ extending from the second surface 513$b$ to the conductive vias 512 is formed, and the cavity 510$r$ exposes the conductive vias 512.

Figure 14F:
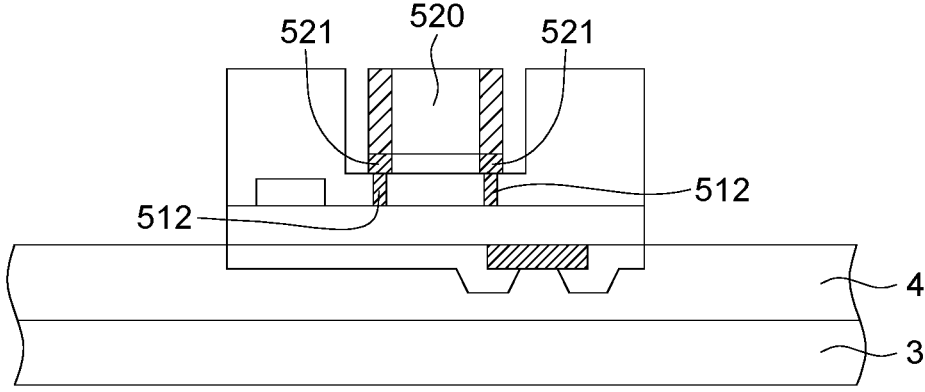

As shown in FIG. 14F, at least one passive component 520 is disposed within the cavity 510$r$, wherein the second bonding pads 521 of the passive component 520 are electrically connected with the conductive vias 512 respectively.

Figure 14G:
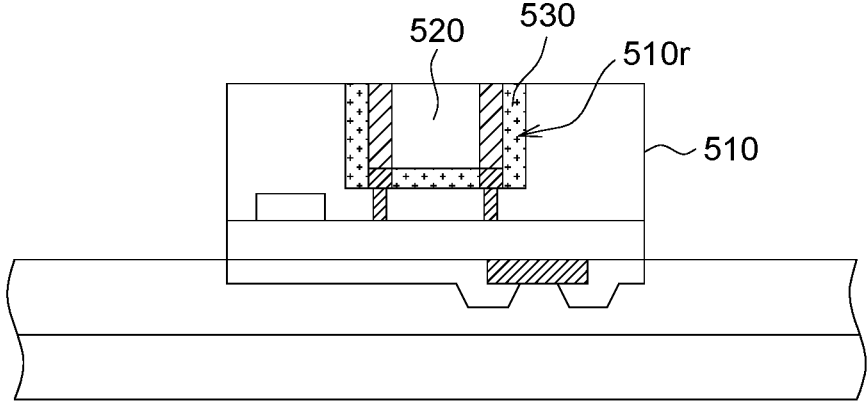

As shown in FIG. 14G, the encapsulating material 530 encapsulating the passive component 520 is formed within the cavity 510r to combine the semiconductor die 510 and the passive component 520. Then, the carrier 3 and the release layer 4 are removed.

To sum up, the embodiments of the present disclosure provide a die package, an IC package and manufacturing processes thereof. In an embodiment, the die package includes the semiconductor die, the passive component and the RDL. The semiconductor die and the passive component are connected with the RDL formed in RDL process. As a result, the passive component could be disposed as close as possible to the semiconductor die, and accordingly noise could effectively be reduced and the dimensions (length, width and thickness) of the die package could be significantly reduced.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A die package, comprising:
    a semiconductor die with a first bonding pad and a conductive via in the semiconductor die;
    a passive component with a second bonding pad;
    a molding compound enclosing the semiconductor die; and
    a RDL layer over the semiconductor die, the RDL layer electrically connecting to the first bonding pad;
    wherein the semiconductor die has a cavity, the passive component is disposed inside the cavity of the semiconductor die, and the second bonding pad of the passive component is electrically connected with the conductive via in the semiconductor die.

2. The die package in claim 1, wherein the cavity is located on a backside of the semiconductor die such that the conductive via is revealed through the cavity.

3. The die package in claim 2, further comprising an encapsulating material filled between walls of the cavity and the passive component.

4. The die package in claim 1, further comprising a heat spreader under the semiconductor die and the passive component, and the semiconductor die and the passive component are attached to the heat spreader through a thermal conducting die attach material.

5. An IC package, comprising:
    the die package of claim 1; and
    a semiconductor component under the die package.

6. The IC package in claim 5, wherein the semiconductor component is a SOC chip, and the SOC chip is electrically connected to the die package through a plurality of solder bumps.

7. The IC package in claim 6, further comprising a laminated substrate under the SOC chip, and the SOC chip is electrically connected to the laminated substrate through wiring bonding or solder bonding.

8. The IC package in claim 5, wherein the semiconductor component is a SOC chip, and the semiconductor die of the die package is a DRAM chip.

9. The IC package in claim 5, wherein the semiconductor component is another die package of claim 1.

10. The IC package in claim 9, wherein the semiconductor die of the die package is a DRAM chip, and the semiconductor die of the semiconductor component is another DRAM chip.

11. The IC package in claim 9, wherein the another die package comprises a through silicon via (TSV) or a through molding via (TMV).

12. The IC package in claim 9, wherein the die package is directly bonded to the semiconductor component through a plurality of solder bumps.

13. The IC package in claim 9, wherein a plurality of dummy bumps are positioned between the die package and the semiconductor component.

14. The IC package in claim 9, wherein the die package and the semiconductor component are partially and vertically overlapped, and a supporting spacer is positioned under the die package and next to the semiconductor component.

* * * * *